United States Patent [19]

Sasaki

[11] 4,433,303
[45] Feb. 21, 1984

[54] PUSH-PULL AMPLIFIER CIRCUIT WITH FIELD-EFFECT TRANSISTORS

[75] Inventor: Katuhiro Sasaki, Tokyo, Japan

[73] Assignee: Pioneer Electronics Corporation, Tokyo, Japan

[21] Appl. No.: 298,143

[22] Filed: Aug. 31, 1981

[30] Foreign Application Priority Data

Sep. 4, 1980 [JP] Japan ................ 55-126071

[51] Int. Cl.³ .............................................. H03F 3/30
[52] U.S. Cl. .................................... 330/264; 330/265; 330/288; 330/294; 330/304
[58] Field of Search ................ 330/264, 267, 268, 269, 330/288, 294, 302, 304, 265

[56] References Cited

U.S. PATENT DOCUMENTS

| 4,031,481 | 6/1977 | Yoshida | 330/269 |
| 4,335,360 | 6/1982 | Hoover | 330/264 |
| 4,356,453 | 10/1982 | Sueyoshi | 330/264 X |

Primary Examiner—James B. Mullins
Attorney, Agent, or Firm—Sughrue, Mion, Zinn, Macpeak & Seas

[57] ABSTRACT

Disclosed herein is a push-pull amplifier circuit employing field-effect transistors in which the field-effect transistors opposite in electrical conductivity to each other are activated by a common input signal to perform a push-pull operation. Secondary distortion components due to the square-law characteristics of the field-effect transistors are cancelled out by impedance elements each being provided between the source of each field-effect transistor and a common reference potential point.

5 Claims, 2 Drawing Figures

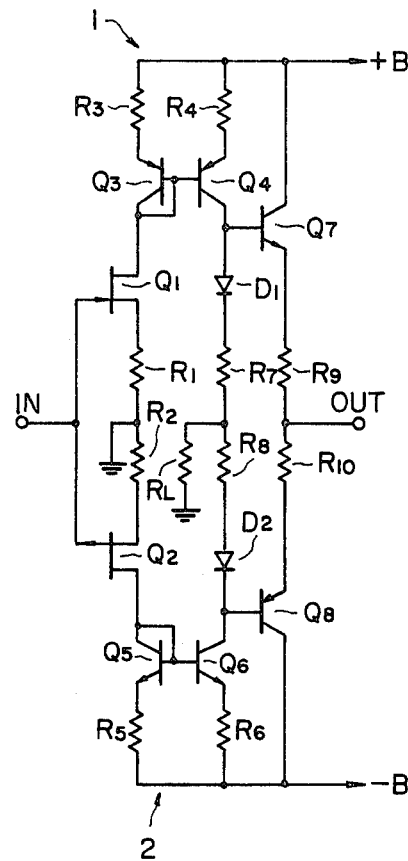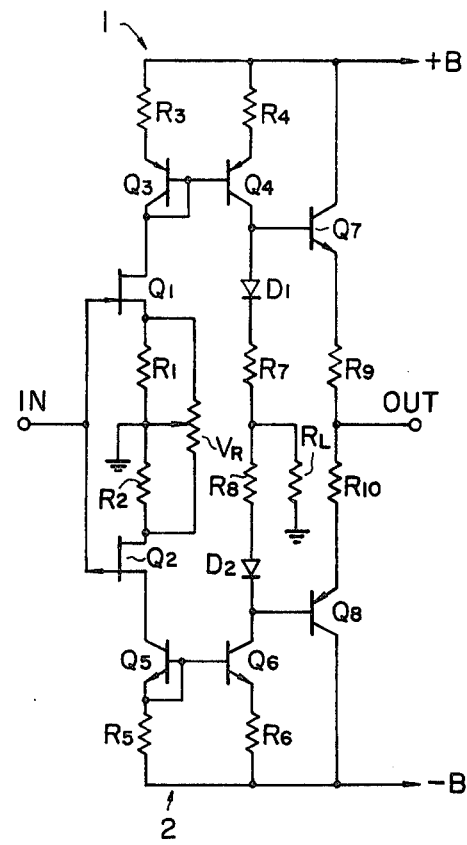

PUSH-PULL AMPLIFIER CIRCUIT WITH FIELD-EFFECT TRANSISTORS

BACKGROUND OF THE INVENTION

The present invention relates to amplifier circuits, and more particularly to a push-pull amplifier circuit using field-effect transistors.

In an amplifier circuit employing field-effect transistors as its amplifying elements, the input-output characteristics of the field-effect transistors are of the square-law characteristics, and therefore the amplified output unavoidably includes non-linear distortion components. The distortion components may be eliminated by employing a negative feedback technique. However, the employment of such a negative feedback technique causes not only to decrease the amplification degree but also to harm the circuit stability, which may result in the oscillation of the circuit.

SUMMARY OF THE INVENTION

Accordingly, an object of the invention is to provide an amplifier circuit in which the secondary distortion components due to the square-law characteristics of field-effect transistors have been eliminated by a simple circuit arrangement, without utilizing a negative feedback technique.

The specific feature of the amplifier circuit according to the invention resides in that field-effect transistors opposite in electrical conductivity to each other are activated by a common input signal to perform a push-pull operation, so that the secondary distortion components produced by the transistors are cancelled out by each other. In the invention, the secondary distortion components are more effectively eliminated by adjusting impedance elements adapted to set circuit currents, so that the currents in the transistors are equal to each other.

BRIEF DESCRIPTION OF THE DRAWINGS

FIGS. 1 and 2 are circuit diagrams showing first and second embodiments of a push-pull amplifier circuit using field-effect transistors according to the invention.

DESCRIPTION OF THE PREFERRED EMBODIMENTS

The invention will be described with reference to the accompanying drawings.

FIG. 1 is a circuit diagram showing a first embodiment of a push-pull amplifier according to the invention. In FIG. 1, reference characters $Q_1$ and $Q_2$ designate an N-channel field-effect transistor and a P-channel field-effect transistor which are subjected to push-pull drive by a common input signal, respectively. A source resistor $R_1$ is connected between the source of the transistor $Q_1$ and a grounding point at a reference potential. Similarly, a source resistor $R_2$ is connected between the source of the transistor $Q_2$ and the grounding point. Current mirror circuits 1 and 2 are provided as the drain loads of the transistors $Q_1$ and $Q_2$, respectively. The current mirror circuit 1 is constituted by a diode-connected input transistor $Q_3$, an output transistor $Q_4$ and emitter resistors $R_3$ and $R_4$. The current transfer ratio is determined to a desired value by suitably setting the ratio of resistances of the emitter resistors $R_3$ and $R_4$. Similarly, the current mirror circuit 2 is constituted by a diode-connected input transistor $Q_5$, an output transistor $Q_6$, and emitter resistors $R_5$ and $R_6$. The current transfer ratio is determined from the ratio of resistances of the resistors $R_5$ and $R_6$.

The output currents of the output transistors $Q_4$ and $Q_6$ in the two current mirror circuits 1 and 2 are applied to a common load resistor $R_L$ respectively through a series circuit of a diode $D_1$ and a resistor $R_7$ and a series circuit of a diode $D_2$ and a resistor $R_8$. Voltage drops across these series circuits are employed as base bias sources for output power transistors $Q_7$ and $Q_8$ in a SEPP (single ended push-pull) arrangement. The emitter follower outputs of the output transistors $Q_7$ and $Q_8$ are supplied to a load such as a loudspeaker (not shown) through resistors $Q_9$ and $Q_{10}$, respectively.

If the gate-source voltages of the input transistors $Q_1$ and $Q_2$ are represented by $V_{GS1}$ and $V_{GS2}$, and currents in the transistors $Q_1$ and $Q_2$ are represented by $I_1$ and $I_2$, respectively, then the following equations are established:

$$I_1 = (V_i - V_{GS1})/R_1 \qquad (1)$$

$$I_2 = (V_i - V_{GS2})/R_2 \qquad (2)$$

where $V_i$ is the input signal voltage.

The currents $I_1$ and $I_2$ are outputted after being subjected to current conversion in the predetermined ratios by the current mirror circuits 1 and 2, respectively. Therefore, if the current transfer ratios are one (1), then the currents represented by equations (1) and (2) are outputted, as they are. The currents are supplied to the common load resistors $R_L$ respectively through the bias circuits comprising the diodes $D_1$ and $D_2$. If the resistors $R_1$ and $R_2$ are equal in resistance to each other, then the DC components of the output currents of the current mirror circuits 1 and 2 are equal to each other. Therefore, in this case, the DC components are not allowed to flow to the resistor $R_L$; that is, only the AC components are allowed to flow to the resistor $R_L$.

The amplifying transistors $Q_1$ and $Q_2$ implement a push-pull operation by receiving the common input signal, and therefore the AC current components are opposite in phase to each other. Accordingly, the level of an AC current carried by the resistor $R_L$ is twice that of the output AC current of each of the current mirror circuits 1 and 2. As is apparent from equations (1) and (2), the output AC currents include secondary distortion components attributing to the square-law characteristic of a field-effect transistor. Under the conditions that $R_1 = R_2$ and the current transfer ratios of the current mirror circuits 1 and 2 are equal to each other, the secondary distortion components are equal in level to each other and are in phase with each other. Therefore, currents due to the secondary distortion components are cancelled out and a distortionless signal is supplied to the common load resistor $R_L$. In the above-described example, the emitter follower output transistors $Q_7$ and $Q_8$ are driven in a push-pull mode by the collector outputs of the transistors $Q_4$ and $Q_6$ to apply power to a common load such as a loudspeaker (not shown). Therefore, according to a principle similar to the above-described one, a distortionless signal is applied to the common load such as a loudspeaker.

FIG. 2 is a circuit diagram showing a second embodiment of the push-pull amplifier according to the invention. In FIG. 2, like parts or like components are designated by like reference characters or like reference numerals as used in FIG. 1. The second embodiment in FIG. 2 is different from the first embodiment in FIG. 1 only in that a variable resistor VR is connected between the sources of the transistors $Q_1$ and $Q_2$ and its movable terminal (or the wiper terminal) is grounded, so that equivalently the resistors $R_1$ and $R_2$ are connected in parallel to the halves of the variable resistor VR.

In the first embodiment shown in FIG. 1, the secondary distortion due to the push-pull operation may not be completely eliminated unless the source resistors $R_1$ and $R_2$ are accurately equal to each other. However, the difficulty can be eliminated by the provision of the variable resistor VR thus connected, because the variation in resistance of the source resistors $R_1$ and $R_2$ can be corrected by adjusting the variable resistor VR. In the second embodiment, it should be appreciated that the resistance of the variable resistor is much larger than that of each of the resistors $R_1$ and $R_2$ ($VR >> R_1$ or $R_2$).

As is apparent from the above description, the push-pull circuit according to the invention is advantageous in that the secondary distortion due to the square-law characteristic of a field-effect transistor can be simply eliminated without utilizing a negative feedback technique.

In the above-described embodiments, the currents of the amplifying transistors $Q_1$ and $Q_2$ are applied through the current mirror circuits to the load. However, it is obvious that circuits equivalent in function to the current mirror circuits can be employed. Furthermore, if instead of the source resistors, impedance elements dependent on frequency are employed, then the push-pull amplifier circuit can be modified into an amplifier circuit whose gain characteristic is dependent on frequency. Therefore, for instance a distortionless equalizer amplifier can be obtained.

What is claimed is:

1. A push-pull amplifier circuit comprising:
   first and second field-effect transistors opposite in electrical conductivity to each other, a common input signal being applied to the gates of said first and second field-effect transistors;
   first and second impedance elements connected respectively between the source of said first field-effect transistor and a common reference potential point and between the source of said second field-effect transistor and said common reference potential point; and
   current generating means, comprising first and second current mirror circuits receiving inputs from said first and second field-effect transistors, respectively, for outputting currents which have predetermined ratios with respect to currents in said first and second field-effect transistors, respectively, said currents thus outputted being applied to a common load.

2. The push-pull amplifier circuit as claimed in claim 1, wherein said first and second impedance elements are provided with means for adjusting the impedances of said first and second impedance elements to be equal to each other.

3. The push-pull amplifier circuit as claimed in claim 1 or 2 wherein said current mirror circuits each comprise a diode-connected input transistor, an output transistor and emitter resistors coupled to the emitters of said input and output transistors.

4. The push-pull amplifier circuit as claimed in claim 2 wherein said first and second impedance elements are resistors and said adjusting means is a variable resistor and wherein the resistance of said variable resistor is much larger than the resistance of each of said resistors.

5. The push-pull amplifier circuit as claimed in claim 1 or 2 wherein said first and second impedance elements are of frequency dependence.

* * * * *